United States Patent
Osada et al.

(10) Patent No.: US 12,305,036 B2
(45) Date of Patent: May 20, 2025

(54) EPOXY RESIN COMPOSITION FOR SEMICONDUCTOR ENCAPSULATION AND SEMICONDUCTOR DEVICE

(71) Applicant: Shin-Etsu Chemical Co., Ltd., Tokyo (JP)

(72) Inventors: Shoichi Osada, Annaka (JP); Hiroki Oishi, Tokyo (JP); Norifumi Kawamura, Annaka (JP); Kenji Hagiwara, Annaka (JP); Ryuhei Yokota, Annaka (JP); Masahiro Kaneta, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 47 days.

(21) Appl. No.: 16/913,836

(22) Filed: Jun. 26, 2020

(65) Prior Publication Data
US 2021/0002474 A1    Jan. 7, 2021

(30) Foreign Application Priority Data
Jul. 5, 2019    (JP) ................. 2019-125935

(51) Int. Cl.
| | | |
|---|---|---|
| C08L 63/00 | (2006.01) | |
| C08K 5/21 | (2006.01) | |
| H01L 21/02 | (2006.01) | |
| C08K 3/013 | (2018.01) | |
| C08K 3/22 | (2006.01) | |
| C08K 5/05 | (2006.01) | |

(52) U.S. Cl.
CPC ........ *C08L 63/00* (2013.01); *H01L 21/02104* (2013.01); *C08K 3/013* (2018.01); *C08K 2003/2217* (2013.01); *C08K 2003/2248* (2013.01); *C08K 2003/2262* (2013.01); *C08K 2003/2265* (2013.01); *C08K 2003/2289* (2013.01); *C08K 2003/2293* (2013.01); *C08K 2003/2296* (2013.01); *C08K 5/05* (2013.01); *C08K 5/21* (2013.01); *C08L 2203/206* (2013.01)

(58) Field of Classification Search
CPC .................... C08L 63/00; C08K 5/21
See application file for complete search history.

(56) References Cited

U.S. PATENT DOCUMENTS

| | | | |
|---|---|---|---|
| 7,060,421 B2 | 6/2006 | Naundorf et al. | |
| 11,174,402 B2* | 11/2021 | Meura ..................... | C08K 3/36 |
| 2016/0244590 A1* | 8/2016 | Takada .................... | C08K 3/346 |
| 2018/0155489 A1* | 6/2018 | Ushiyama ................ | C08J 5/243 |
| 2019/0055377 A1 | 2/2019 | Tsutsumi et al. | |
| 2019/0292386 A1 | 9/2019 | Meura | |

FOREIGN PATENT DOCUMENTS

| | | | |
|---|---|---|---|
| CN | 109153858 A | | 1/2019 |
| JP | 2001-106771 A | | 4/2001 |
| JP | 2004-534408 A | | 11/2004 |
| JP | 2006022188 A | * | 1/2006 |
| JP | 2008204895 A | * | 9/2008 |
| JP | 2013-147549 A | | 8/2013 |
| JP | 2015-108123 A | | 6/2015 |
| JP | 2019-36642 A | | 3/2019 |
| WO | WO 2015/033295 A1 | | 3/2015 |
| WO | WO 2017/138487 A1 | | 8/2017 |
| WO | WO-2017199639 A1 | * | 11/2017 ............. B33Y 70/00 |

OTHER PUBLICATIONS

Japanese Office Action for Japanese Application No. 2019-125935, dated Jun. 14, 2022, with an English translation.
Chinese Office Action and Search Report for Chinese Application No. 202010635749.9, dated Nov. 9, 2023, with English translation.

* cited by examiner

*Primary Examiner* — Vickey Nerangis
(74) *Attorney, Agent, or Firm* — Birch, Stewart, Kolasch & Birch, LLP

(57) ABSTRACT

Provided are an epoxy resin composition for semiconductor encapsulation; and a semiconductor device having a cured product of such composition. The composition has a superior curability, and a metal layer (plated layer) can be selectively and easily formed on the surface of or inside the cured product of this composition via an electroless plating treatment. The composition of the present invention contains:
 (A) an epoxy resin;
 (B) a phenolic curing agent;
 (C) a curing accelerator having a urea structure;
 (D) a laser direct structuring additive; and
 (E) an inorganic filler.

15 Claims, No Drawings

EPOXY RESIN COMPOSITION FOR SEMICONDUCTOR ENCAPSULATION AND SEMICONDUCTOR DEVICE

BACKGROUND OF THE INVENTION

Field of the Invention

The present invention relates to an epoxy resin composition for semiconductor encapsulation; and a semiconductor device having a cured product of this composition. Specifically, the composition of the invention is such that a coating layer or wiring layer can be formed on the surface of or inside a cured product of the composition via electroless plating.

Background Art

An electromagnetic shielding property is required in semiconductor devices installed in communication devices such as mobile phones and smartphones, for the purpose of preventing malfunction caused by electromagnetic noises that are generated by these devices. As a method for imparting such electromagnetic shielding property to a semiconductor device, there are known, for example, a method using a metal plate(s); and a method where a metal layer is to be deposited on the surface of a semiconductor via sputtering. However, the method for imparting the electromagnetic shielding property by means of a sheet metal is not suitable for thinner and smaller communication devices; and the method of depositing a metal layer via sputtering requires a high-vacuum condition in its process, which makes continuous production impossible and thus leads to a poor productivity.

Further, with the developments in wearable devices or the like, it is required that semiconductor devices be thinned even more. Here, by forming a metal wiring pattern on the surface of a semiconductor encapsulation material via plating, another semiconductor device can be directly produced on a semiconductor device.

Furthermore, other than wirings, attempts have also been made to downsize semiconductor devices for use in communication devices by forming an antenna(s) on the surface of a semiconductor encapsulation material.

As part of such development, in the case of wafer-level chip size packaging in recent years, there has been developed a technique where by providing a rewiring layer outside a chip(s), a plurality of chips can be connected to one another via high-density wiring. However, as a method for forming rewiring, electrolytic copper plating or the like is now dominant even though such method includes significantly cumbersome steps such as resist application, pattern formation, washing, sputtering, resist removal and electrolytic plating. In addition, a chemical resistance is required even in resins and chips if performing a method evolving electrolytic plating.

In this regard, as a method for selectively forming a plating pattern, there has been developed a technique called laser direct structuring (referred to as "LDS" hereunder) (Japanese Unexamined Patent Application Publication (Translation of PCT Application) No. 2004-534408). This technique is such that by adding an LDS additive to a resin, and then using a laser to activate the surface of or the inner region of a cured product of the resin, a plated layer(s) can be formed only in parts that have been irradiated with the laser. This technique is characterized in that a metal layer can be formed on the surface of or inside a cured product without using, for example, an adhesion layer and a resist (JP-A-2015-108123 and WO2015/033295).

SUMMARY OF THE INVENTION

An LDS additive is a composite metal oxide and exhibits a Lewis acidity. Thus, there has been a problem that as a result of using an LDS additive in a conventional epoxy resin composition for semiconductor encapsulation that contains a basic curing accelerator, a catalytic activity will be inhibited such that a curability will be significantly impaired. There exists a method of avoiding a direct contact between a Lewis acidic additive and a curing accelerator by coating the surface of such Lewis acidic additive with a silane coupling agent or the like when adding the Lewis acidic additive to a resin composition for semiconductor encapsulation. However, this method has a problem that since laser irradiation is performed after curing the composition so as to activate the LDS additive, the activation will be inhibited if the surface of the LDS additive is coated. In this way, there has never been an example where an LDS technique is applied to a heat-curable resin such as an epoxy resin for semiconductor encapsulation.

Therefore, it is an object of the present invention to provide an epoxy resin composition for semiconductor encapsulation that has a superior curability, and is capable of yielding a cured product where on the surface or in an inner region of such cured product, a plated layer(s) can be formed only in parts that have been irradiated with a laser.

The inventors of the present invention diligently conducted studies to solve the aforementioned problems and completed the invention as follows. That is, the inventors of the invention found that cure inhibition could be prevented by using a curing accelerator having a urea structure in an LDS additive-containing epoxy resin composition.

Specifically, the present invention is to provide the following epoxy resin composition for semiconductor encapsulation; and a semiconductor device having a cured product of such composition.

[1]

An epoxy resin composition for semiconductor encapsulation, comprising:
(A) an epoxy resin;
(B) a phenolic curing agent;
(C) a curing accelerator having a urea structure;
(D) a laser direct structuring additive; and
(E) an inorganic filler.

[2]

The epoxy resin composition for semiconductor encapsulation according to [1], wherein the component (D) is a metal oxide having a spinel structure, and is represented by the following average composition formula (1):

$$AB_2O_4 \qquad (1)$$

wherein A represents one or more metal elements selected from iron, copper, nickel, cobalt, zinc, magnesium and manganese, B represents iron or chrome, provided that A and B do not both represent iron.

[3]

The epoxy resin composition for semiconductor encapsulation according to [1] or [2], wherein the component (D) is added in an amount of 20 to 100 parts by mass per a total of 100 parts by mass of the components (A) and (B).

[4]

The epoxy resin composition for semiconductor encapsulation according to any one of [1] to [3], wherein the component (D) has an average particle size of 0.01 to 5 μm.

[5]

The epoxy resin composition for semiconductor encapsulation according to any one of [1] to [4], wherein the component (D) is such that after an aqueous dispersion of the component (D) is prepared by immersing 10 parts by mass of the component (D) in 50 parts by mass of pure water, and then left to stand at 125±3° C. for 20±1 hours, a sodium ion concentration in the aqueous dispersion of the component (D) is not higher than 50 ppm, and a chloride ion concentration in the aqueous dispersion of the component (D) is not higher than 50 ppm.

[6]

The epoxy resin composition for semiconductor encapsulation according to any one of [1] to [5], wherein a top cut particle size of the component (E) in a wet sieve method is 5 to 25 μm, and an average particle size of the component (E) is 0.5 to 10 μm.

[7]

A semiconductor device having a cured product of the epoxy resin composition for semiconductor encapsulation according to any one of [1] to [6].

[8]

The semiconductor device according to [7], wherein at least part of the cured product is plated.

[9]

A method for producing the semiconductor device according to [8], wherein parts that have been irradiated with a laser are plated.

The composition of the present invention is superior in curability. Further, a metal layer (plated layer) can be selectively and easily formed on the surface of or inside the cured product of the composition of the present invention. Thus, the composition of the present invention is suitable as an encapsulation material for, for example, a small and thin communication device requiring the electromagnetic shielding property, an antenna-equipped small and thin semiconductor device and a wiring layer-equipped small and thin semiconductor device. Further, a semiconductor device having the cured product of the composition of the invention can be obtained via continuous production, which leads to an excellent productivity.

DETAILED DESCRIPTION OF THE INVENTION

The present invention is described in greater detail hereunder.

(A) Epoxy Resin

As an epoxy resin as a component (A), there may be used an epoxy resin(s) that have been conventionally used in the technical field of epoxy resin compositions for encapsulation. Examples of such epoxy resins include novolac-type epoxy resins such as a phenol novolac-type epoxy resin, an ortho-cresol novolac type epoxy resin and a naphthol novolac-type epoxy resin; crystalline epoxy resins such as a biphenyl-type epoxy resin, a bisphenol-type epoxy resin, a stilbene-type epoxy resin and a dihydroanthracene diol-type epoxy resin; multifunctional epoxy resins such as a triphenolmethane-type epoxy resin and an alkyl-modified triphenolmethane type epoxy resin; aralkyl-type epoxy resins such as a phenylene backbone-containing phenol aralkyl type epoxy resin, a biphenylene backbone-containing biphenyl aralkyl type epoxy resin, a phenylene backbone-containing naphthol aralkyl type epoxy resin and a biphenylene backbone-containing naphthol biphenyl aralkyl type epoxy resin; naphthol-type epoxy resins such as a dihydroxynaphthalene-type epoxy resin and an epoxy resin obtained by glycidyl etherification of dihydroxynaphthalene dimer; triazine nucleus-containing epoxy resins such as triglycidyl isocyanurate and monoallyl diglycidyl isocyanurate; and cyclic hydrocarbon compound-modified phenol type epoxy resins such as a dicyclopentadiene-modified phenol type epoxy resin. Any one of these epoxy resins may be used singularly, or two or more of them may be used in combination. Among these epoxy resins, in terms of controlling the viscosity of a composition to a lower level, preferred are a novolac-type epoxy resin such as an ortho-cresol novolac type epoxy resin; an aralkyl-type epoxy resin such as a biphenyl aralkyl-type epoxy resin; and a biphenyl-type epoxy resin.

It is preferred that the component (A) be contained in the composition of the present invention by an amount of 4.0 to 40.0% by mass, more preferably 4.5 to 30.0% by mass, even more preferably 5.0 to 20.0% by mass.

(B) Phenolic Curing Agent

As a phenolic curing agent as a component (B), there may be used a phenolic resin(s) that have been conventionally used in the technical field of epoxy resin compositions for encapsulation. Examples of such curing agent include a novolac-type phenolic resin, a naphthalene ring-containing phenolic resin, an aralkyl-type biphenyl resin, an aralkyl-type phenolic resin, a triphenolalkane-type phenolic resin, a biphenyl-type phenolic resin, an alicyclic phenolic resin, a heterocyclic phenolic resin, naphthalene ring-containing phenolic resin, and bisphenol-type phenolic resins such as a bisphenol A-type phenolic resin and a bisphenol F-type phenolic resin. Any one of these curing agents may be used singularly, or two or more of them may be used in combination. Among these curing agents, preferred are a novolac-type phenolic resin, an aralkyl-type biphenyl resin and an aralkyl-type phenolic resin; particularly preferred is an aralkyl-type phenolic resin.

A blending ratio between the epoxy resin and the curing agent (epoxy group/phenolic hydroxyl group), in terms of an equivalent ratio, is preferably 0.5 to 1.5, more preferably 0.8 to 1.2. When this blending ratio is extremely small, an economically disadvantageous status will be incurred as an extremely large amount of the curing agent is now used. When such blending ratio is extremely large, curing will take place in an insufficient manner as an extremely small amount of the curing agent is now used.

(C) Curing Accelerator

A curing accelerator as a component (C) is characterized in that it has a urea structure, and is capable of promoting a cross-linking reaction between the epoxy groups in the component (A) and the phenolic hydroxyl groups in the component (B). Examples of such curing accelerator as the component (C) include N,N,N',N'-tetramethylurea, N'-phenyl-N,N-dimethylurea, N,N-diethylurea, N'-[3-[[[(dimethylamino)carbonyl]amino]methyl]-3,5,5-trimethylcyclohexyl]-N,N-dimethylurea and N,N'''-(4-methyl-1,3-phenylene)bis(N',N'-dimethylurea). Any one of these curing accelerators may be used singularly, or two or more of them may be used in combination.

Particularly, N,N-diethylurea and N'-[3-[[[(dimethylamino)carbonyl]amino]methyl]-3,5,5-trimethylcyclohexyl]-N,N-dimethylurea are preferred as they have a potential of causing curing reaction only when a certain temperature has been reached.

It is preferred that the component (C) be added in an amount of 0.5 to 10.0 parts by mass, more preferably 1.5 to 6.0 parts by mass, per a total of 100 parts by mass of the components (A) and (B). When the amount of the component (C) added is within these ranges, a cured product can be easily obtained as the epoxy groups in the component (A) and the phenolic hydroxyl groups in the component (B) shall react with each other rapidly.

Further, in addition to the urea structure-containing curing accelerator as the component (C), a urea structure-free curing accelerator that is normally used in an epoxy resin composition may also be used in combination, provided that the usage of such curing accelerator will not inhibit the curability of the composition as a whole. As the curing accelerator other than the urea structure-containing curing accelerator as the component (C), there may be listed, for example, imidazoles such as 2-methylimidazole, 2-ethyl-4-methylimidazole, 2-methyl-4-ethylimidazole, 2-phenylimidazole and 2-methyl-4-methylimidazole; tertiary amines such as 1,8-diazabicyclo[5.4.0]undecene-7, triethylenediamine and benzyldimethylamine; organic phosphines such as triphenylphosphine, tributylphosphine and tetraphenylphosphonium tetraphenylborate; and curing accelerators prepared by microencapsulating these curing accelerators.

(D) Laser Direct Structuring Additive (LDS Additive)

An LDS additive as a component (D) is a metal oxide having a spinel structure, and is represented by the following average composition formula (1).

$$AB_2O_4 \qquad (1)$$

In the above formula, A represents one or more metal elements selected from iron, copper, nickel, cobalt, zinc, magnesium and manganese, B represents iron or chrome, provided that A and B do not both represent iron.

Specific examples of such metal oxide include $FeCr_2O_4$, $CuCr_2O_4$, $NiCr_2O_4$, $CoCr_2O_4$, $ZnCr_2O_4$, $MgCr_2O_4$, $MnCr_2O_4$, $CuFe_2O_4$, $NiFe_2O_4$, $CoFe_2O_4$, $ZnFe_2O_4$, $MgFe_2O_4$ and $MnFe_2O_4$.

There are no particular restrictions on a method for producing these metal oxides as LDS additives. In fact, there may be used those produced by, for example, calcining a metal oxide mixed powder, and oxidizing or performing chemical synthesis on a metal powder mixture.

It is preferred that the LDS additive is in the form of fine particles. In terms of a volume particle size distribution measurement value measured by a laser diffraction-type particle size distribution meter, an average particle size of such fine particles is preferably 0.01 to 5 μm, particularly preferably 0.05 to 3.0 μm. When the average particle size of the LDS additive is 0.01 to 5 μm, a plating property will be improved as the generation of metallic species serving as plating catalysts shall be promoted when a package surface has been irradiated by a laser with the LDS additive being already uniformly distributed in the entire resin.

It is preferred that the LDS additive be added in an amount of 20 to 100 parts by mass, more preferably 30 to 80 parts by mass, per the total of 100 parts by mass of the components (A) and (B). When this amount is smaller than 20 parts by mass, the plating property will deteriorate as metal species serving as plating catalysts will be generated in an insufficient manner at the time of performing laser irradiation. When this amount is larger than 100 parts by mass, there will be a higher ratio of metal oxide particles having a small particle size, which may cause deterioration in fluidity and moldability of the composition.

Further, preferred is a type of LDS additive such that after immersing 10 parts by mass thereof in 50 parts by mass of pure water under a condition of 125° C.±3° C./20±1 hours, inorganic ion concentrations in the aqueous dispersion that are not higher than certain levels are observed; it is particularly preferable when a sodium ion concentration is not higher than 50 ppm, and a chloride ion concentration is not higher than 50 ppm. When the sodium ion concentration and the chloride ion concentration are each higher than 50 ppm, the cured product may exhibit an impaired electric property in a high-temperature and high-humidity environment, which may cause the metal parts of a semiconductor device to be corroded.

The sodium ion concentration is a value measured by an atomic absorption photometer; and the chloride ion concentration is a value measured by ion chromatography.

Here, if the ion concentrations in a commercially available LDS additive are greater than the above upper limits, this commercially available LDS additive may simply be purified by, for example, being repeatedly washed with water until the ion concentrations reach the preferable levels, and then be dried before use.

(E) Inorganic Filler

As an inorganic filler as a component (E), there may be used materials such as a molten silica, a crystalline silica, cristobalite, alumina, silicon nitride, aluminum nitride, boron nitride, titanium oxide, glass fibers, alumina fibers, zinc oxide, talc and calcium carbide (provided that the aforementioned component (D) is excluded). Two or more of these materials may be used in combination. A top cut particle size of the inorganic filler (E) in a wet sieve method is preferably 5 to 25 μm, more preferably 10 to 20 μm; an average particle size of the inorganic filler (E) is preferably 0.5 to 10 μm, more preferably 3 to 7 μm, in terms of a volume particle size distribution measurement value measured by a laser diffraction-type particle size distribution meter.

Here, the term "top cut particle size" is defined as follows. That is, with respect to a mesh opening(s) of a sieve used for classification in a wet sieve method for sieving an inorganic filler produced, "top cut particle size" refers to a value at which a ratio of particles larger than these openings is not higher than 2% by volume in terms of a volume particle size distribution measurement value measured by a laser diffraction method. When the top cut particle size is larger than 25 μm, it may be difficult to form wiring layers and vias as a part(s) exposing the surface of the inorganic filler shall not be plated when irradiated with a laser.

It is preferred that the inorganic filler (E) be added in an amount of 50 to 1,500 parts by mass, more preferably 150 to 1,200 parts by mass, per the total of 100 parts by mass of the components (A) and (B).

Other Additives

The resin composition of the present invention may further contain an adhesion aid, a mold release agent, a flame retardant, an ion trapping agent, a flexibility-imparting agent and other additives, provided that the effects of the present invention will not be impaired.

Examples of the adhesion aid include epoxysilanes such as γ-glycidoxypropyltrimethoxysilane, γ-glycidoxypropylmethyldiethoxysilane and β-(3,4-epoxycyclohexyl)ethyltrimethoxysilane; aminosilanes such as N-(β-aminoethyl)-γ-aminopropyltrimethoxysilane, a reactant of imidazole and γ-glycidoxypropyltrimethoxysilane, γ-aminopropyltriethoxysilane, and N-phenyl-γ-aminopropyltrimethoxysilane; and mercaptosilanes such as γ-mercaptosilane and γ-(thiiranylmethoxy)propyltrimethoxysilane. Any one of these adhesion aids may be used singularly, or two or more of them may be used in combination.

Examples of the mold release agent include waxes such as a carnauba wax, a rice wax, polyethylene, oxidized polyethylene, montanic acid, and an ester compound of montanic acid with, for example, a saturated alcohol, 2-(2-hydroxyethylamino)ethanol, ethylene glycol or glycerin; stearic acid, stearic acid ester, stearamide, ethylenebisstearamide, and a copolymer of ethylene and vinyl acetate. Any one of these mold release agents may be used singularly, or two or more of them may be used in combination.

Examples of the flame retardant include a halogenated epoxy resin, a phosphazene compound, a silicone compound, a zinc molybdate-supported talc, a zinc molybdate-supported zinc oxide, aluminum hydroxide, magnesium hydroxide, molybdenum oxide and antimony trioxide. Any one of these flame retardants may be used singularly, or two or more of them may be used in combination. However, a phosphazene compound, a zinc molybdate-supported zinc oxide and molybdenum oxide are preferably used in terms of environmental burdens and ensuring fluidity.

Examples of the ion trapping agent include a hydrotalcite compound, a bismuth compound and a zirconium compound. Any one of these ion trapping agents may be used singularly, or two or more of them may be used in combination.

Examples of the flexibility-imparting agent include silicone compounds such as a silicone oil, a silicone resin, a silicone-modified epoxy resin and a silicone-modified phenolic resin; and thermoplastic elastomers such as a styrene resin and an acrylic resin. Any one of these flexibility-imparting agents may be used singularly, or two or more of them may be used in combination.

The amount of these other additives contained in the epoxy resin composition may be appropriately determined in a way such that each additive will be able to fully exhibit its function(s); for example, the additives may be in an amount of 0.1 to 10 parts by mass per the total of 100 parts by mass of the components (A) and (B).

Method for Producing Composition

The composition of the present invention may, for example, be produced as follows. That is, given amounts of the epoxy resin, phenolic curing agent, curing accelerator, LDS additive, inorganic filler and other materials are to be blended together, followed by using a mixer or the like to mix them in a sufficiently uniform manner, and then using a heated roll mill, a kneader, an extruder or the like to melt and mix the ingredients. Next, the molten mixture is cooled and solidified before being crushed into an appropriate size(s). The composition thus obtained can be used as a molding material. Further, the composition thus obtained may also be tableted and be used in the form of a tablet(s).

The composition of the present invention is effective as an encapsulation resin for use in a semiconductor device such as that of a transistor-type, a module-type, a DIP-type, a SO-type, a flatpack-type and a ball grid array-type. There are no particular restrictions on a method for encapsulating a semiconductor device using the composition of the present invention. There may be employed a conventional molding method such as transfer molding, injection molding and cast molding. Transfer molding is particularly preferred.

Although there are no particular restrictions on a molding (curing) condition for the composition of the present invention, it is preferred that the composition be treated at 160 to 190° C. for 90 to 300 sec. Further, it is preferred that post curing be performed at 170 to 250° C. for 2 to 16 hours.

The composition of the present invention is superior in curability and moldability. Thus, the composition can be used as a material for transfer molding. Moreover, the composition of the invention is suitable for use in, for example, a communication device requiring an electromagnetic shielding property, since a metal layer formed via electroless plating can be easily and selectively provided on the surface of or inside the cured product of the composition of the invention through laser direct structuring.

Semiconductor Device

A semiconductor device of the present invention has the cured product of the epoxy resin composition of the invention that is used for semiconductor encapsulation, and is characterized by having at least part of the cured product plated. There are no particular restrictions on a method for performing plating. There may be employed, for example, a method where the surface or inner region of the cured product is to be irradiated with a laser of a wavelength selected from 248 nm, 308 nm, 355 nm, 532 nm, 1064 nm or 10,600 nm in a way such that a desired wiring, pore diameter and depth will be achieved, followed by immersing the irradiated cured product in a plating solution containing target metal components such as Cu, Ni and Ag. It is preferred that the output of the laser be in a range of 0.01 to 15 W, and that the scanning rate of the laser be in a range of 1 to 1,000 mm/s. Other than the target metal components, the plating solution may also contain a complexing agent, a pH adjuster, an electric conducting salt, a reductant and the like, and a commercially available plating solution of such kind can be used. The temperature of the plating solution is 50 to 80° C., and an immersion time is 20 to 120 min.

Working Example

The present invention is described in greater detail hereunder with reference to working and comparative examples. However, the present invention shall not be limited to the following working examples.

Materials used in the working and comparative examples are shown below.

(A) Epoxy Resin
Epoxy resin 1: Ortho-cresol novolac type epoxy resin by DIC "EPICLON N695" (epoxy equivalent 210)
Epoxy resin 2: Biphenyl aralkyl-type epoxy resin by Nippon Kayaku Co., Ltd. "NC-3000" (epoxy equivalent 273)

(B) Phenolic Curing Agent
Curing agent 1: Novolac-type phenolic resin by DIC "TD-2093Y" (hydroxyl equivalent 110)
Curing agent 2: Aralkyl-type phenolic resin by Meiwa Plastic Industries, Ltd. "MEHC-7851SS" (hydroxyl equivalent 175)

(C) Curing Accelerator
Curing accelerator 1: N'[-3-[[[(dimethylamino)carbonyl] amino]methyl]-3,5,5-trimethylcyclohexyl]-N,N-dimethylurea by San-Apro Ltd. "U-cat 3513N"
Curing accelerator 2: 3-phenyl-1,1-dimethylurea by San-Apro Ltd. "U-cat 3512T"
Curing accelerator 3 (for comparative example): 2-ethyl-4-methylimidazole by SHIKOKU CHEMICALS CORPORATION "2E4MZ"
Curing accelerator 4 (for comparative example): Triphenylphosphine by HOKKO CHEMICAL INDUSTRY CO., LTD. "TPP"

(D) LDS Additive
LDS additive 1: EX1816 by Shepherd Color Japan, Inc. ($CuCr_2O_4$, sodium ion concentration: 16 ppm, chloride ion concentration: 14 ppm, average particle size: 0.8 μm)
LDS additive 2: Black 30C940 by Shepherd Color Japan, Inc. ($FeCr_2O_4$, sodium ion concentration: 490 ppm, chloride ion concentration: 57 ppm, average particle size: 1.0 μm)

LDS additive 3: Black 30C933 by Shepherd Color Japan, Inc. (MnFe$_2$O$_4$, sodium ion concentration: 86 ppm, chloride ion concentration: 24 ppm, average particle size: 0.9 μm)

Particularly, the sodium ion concentrations and chloride ion concentrations in the LDS additives 1 to 3 were measured by the following method. An aqueous dispersion was at first prepared by immersing 10 parts by mass of each LDS additive in 50 parts by mass of pure water, followed by leaving such aqueous dispersion to stand at 125±3° C. for 20±1 hours. After a given period of time had passed, this aqueous dispersion was then filtrated with a filter paper, followed by analyzing the filtrate using an atomic absorption photometer so as to obtain the sodium ion concentration. The chloride ion concentration was measured by ion chromatography.

(E) Inorganic Filler

Silica particles 1 by TATSUMORI LTD. "MUF-4" (average particle size 4 μm, top cut particle size 10 μm)

Alumina particles 1 by Admatechs Company Limited "AC9104-SXE" (average particle size 4 μm, top cut particle size 10 μm)

Mold Release Agent

Carnauba wax by TOA KASEI CO., LTD. "TOWAX-131"

The above components were blended together in accordance with the composition ratios (parts by mass) shown in Tables 1 and 2. These components were then melted and mixed, and later cooled before being crushed, thereby obtaining the composition of the invention. Each composition thus obtained was then evaluated by the following methods, and the results thereof are shown in Tables 1 and 2.

Spiral Flow

Using a mold manufactured in accordance with the EMMI standard, measurements were performed under conditions of: molding temperature 175° C., molding pressure 6.9 N/mm$^2$, molding time 300 sec.

Gelation Time

Gelation times were measured in accordance with a gelation time measurement method (method B i.e. plate method) described in ISO8987 (1995).

Cured Product Plating Property Evaluation (Surface Plating Property Evaluation)

A YVO$_4$ laser marker (by KEYENCE CORPORATION, 1064 nm) in a test mode was used to perform marking on the surface of a test specimen prepared under a condition of 175° C., 300 sec.

This test specimen was then immersed in a Ni plating solution for 30 min with the temperature thereof being maintained at 80° C. so as to observe a plating property of the test specimen. The Ni plating solution was prepared by mixing 75 ml of a makeup CNN-mod by Atotech; 30 ml of an Aurotech CNN Part A by Atotech; 395 ml of pure water; and 8 ml of an ammonia water.

Inner Plating Property Evaluation

A laser substrate cutting device MicroLine 5820P (by LPKF) was used to form 10 through holes of a size of 200 μmφ in a cured product having a thickness of 0.20 mm.

This molded product was then immersed in the above plating solution at 65° C. for 30 min so as to plate the through holes. An inner plating property was confirmed by polishing the sections of these through holes, and then using a microscope to observe a plating property therein.

As for the plating property in each example, "×" was given to examples where plated areas were not observed at all; "Δ" was given to examples where discontinuities or skipped parts were observed in partially plated areas; and "○" was given to examples where plated areas were formed in a continuous and uniform manner.

Electric Reliability Evaluation

A DIP 14 pin lead frame with a comb-shaped electrode-wired silicon chip mounted thereon was encapsulated under a condition of 175° C., 300 sec, using each composition prepared in working or comparative examples. Post curing was then performed at 180° C. for four hours to obtain a semiconductor device(s). Ten of the semiconductor devices thus obtained were further left to stand in an environment of 85° C./85% RH, and a voltage of 5V was applied thereto for 336 hours. A resistance(s) was then measured after these 336 hours. Here, semiconductor devices exhibiting a rise in resistance value and an actual resistance of not lower than 100Ω were regarded as failures; whereas semiconductor devices capable of conducting normally were regarded as favorable ones. Particularly, among the ten semiconductor devices, the number of the semiconductor devices that were regarded as favorable was counted.

TABLE 1

| Composition table [Part by mass] | Working example 1 | Working example 2 | Working example 3 | Working example 4 | Working example 5 | Working example 6 | Working example 7 |
|---|---|---|---|---|---|---|---|
| Epoxy resin 1 | 60 | 60 | | | 60 | 60 | 60 |
| Epoxy resin 2 | | | 65 | 65 | | | |
| Curing agent 1 | 40 | 40 | | | 40 | 40 | 40 |
| Curing agent 2 | | | 35 | 35 | | | |
| Curing accelerator 1 | 2 | 2 | 3 | 3 | 2 | 2 | |
| Curing accelerator 2 | | | | | | | 3 |
| Curing accelerator 3 | | | | | | | |
| Curing accelerator 4 | | | | | | | |
| LDS additive 1 | 20 | 40 | 60 | 100 | | | 60 |
| LDS additive 2 | | | | | 40 | | |
| LDS additive 3 | | | | | | 40 | |
| Silica particles 1 | 185 | 400 | 700 | | 400 | 400 | 700 |
| Alumina particles 1 | | | | 1100 | | | |
| Mold release agent | 1 | 1 | 1 | 1 | 1 | 1 | 1 |
| Spiral flow [cm] | 150 | 80 | 120 | 85 | 85 | 85 | 110 |
| Gelation time [sec] | 30 | 30 | 30 | 26 | 34 | 35 | 25 |
| Evaluation of plating property on cured product surface | ○ | ○ | ○ | ○ | ○ | ○ | ○ |

TABLE 1-continued

| Composition table [Part by mass] | Working example 1 | Working example 2 | Working example 3 | Working example 4 | Working example 5 | Working example 6 | Working example 7 |
|---|---|---|---|---|---|---|---|
| Evaluation of plating property inside cured product | ○ | ○ | ○ | ○ | ○ | ○ | ○ |
| Electric reliability evaluation | 10/10 | 10/10 | 10/10 | 10/10 | 4/10 | 8/10 | 10/10 |

TABLE 2

| Composition table [Part by mass] | Comparative example 1 | Comparative example 2 | Comparative example 3 |
|---|---|---|---|
| Epoxy resin 1 | 60 | 60 | |
| Epoxy resin 2 | | | 65 |
| Curing agent 1 | 40 | 40 | |
| Curing agent 2 | | | 35 |
| Curing accelerator 1 | 2 | | |
| Curing accelerator 2 | | | |
| Curing accelerator 3 | | 2 | |
| Curing accelerator 4 | | | 2 |
| LDS additive 1 | | 40 | 60 |
| LDS additive 2 | | | |
| LDS additive 3 | | | |
| Silica particles 1 | 205 | 400 | 700 |
| Alumina particles 1 | | | |
| Mold release agent | 1 | 1 | 1 |
| Spiral flow [cm] | 150 | 100 | Curing failure |
| Gelation time [sec] | 30 | 60 | >60 |
| Evaluation of plating property on cured product surface | x | ○ | Curing failure |
| Evaluation of plating property inside cured product | x | ○ | Curing failure |
| Electric reliability evaluation | 10/10 | 0/10 | Curing failure |

The results shown above indicate that the composition of the present invention has a favorable curability, and that a metal layer can be easily formed on the surface of or inside the cured product of the composition via an electroless plating treatment. Thus, the composition of the present invention is suitable for use in a communication device requiring an electromagnetic shielding property, an antenna-equipped semiconductor device and a semiconductor device requiring a wiring layer to be formed therein.

What is claimed is:

1. An epoxy resin composition for semiconductor encapsulation, comprising:
   (A) an epoxy resin;
   (B) a phenolic curing agent;
   (C) a curing accelerator having a urea structure selected from at least one of N, N,N', N'-tetramethylurea, N'-phenyl-N, N-dimethylurea, N, N-diethylurea, N'-[3-[[[(dimethylamino) carbonyl] amino] methyl]-3,5,5-trimethylcyclohexyl]-N,N-dimethylurea, and N, N'''-(4-methyl-1,3-phenylene)bis(N', N'-dimethylurea);
   (D) a laser direct structuring additive; and
   (E) an inorganic filler, wherein
   a ratio (epoxy group/phenolic hydroxyl group), in terms of an equivalent ratio, between the (A) epoxy resin and (B) the phenolic curing agent, is 0.5 to 1.5, and an amount of the component (C) added is 0.5 to 10.0 parts by mass per a total of 100 parts by mass of the components (A) and (B), an amount of the component (D) added is 20 to 100 parts by mass per a total of 100 parts by mass of the components (A) and (B), an amount of the component (E) added is 50 to 1,500 parts by mass per a total of 100 parts by mass of the components (A) and (B), wherein
   the component (D) is a metal oxide having a spinel structure, and is represented by the following average composition formula (1):

$$AB_2O_4 \qquad (1)$$

wherein A represents one or more metal elements selected from iron, copper and manganese, B represents iron or chromium, provided that A and B do not both represent iron, and
the component (D) is such that after an aqueous dispersion of the component (D) is prepared by immersing 10 parts by mass of the component (D) in 50 parts by mass of pure water, and then left to stand at 125±3° C. for 20±1 hours, a sodium ion concentration in the aqueous dispersion of the component (D) is not higher than 50 ppm, and a chloride ion concentration in the aqueous dispersion of the component (D) is not higher than 50 ppm.

2. The epoxy resin composition for semiconductor encapsulation according to claim 1, wherein the component (D) is added in an amount of 30 to 80 parts by mass per a total of 100 parts by mass of the components (A) and (B).

3. The epoxy resin composition for semiconductor encapsulation according to claim 1, wherein the component (D) has an average particle size of 0.01 to 5 μm.

4. The epoxy resin composition for semiconductor encapsulation according to claim 1, wherein the component (D) is such that after an aqueous dispersion of the component (D) is prepared by immersing 10 parts by mass of the component (D) in 50 parts by mass of pure water, and then left to stand at 125±3° C. for 20±1 hours, a sodium ion concentration in the aqueous dispersion of the component (D) is not higher than 16 ppm, and a chloride ion concentration in the aqueous dispersion of the component (D) is not higher than 14 ppm.

5. The epoxy resin composition for semiconductor encapsulation according to claim 1, wherein a top cut particle size of the component (E) in a wet sieve method is 5 to 25 μm, and an average particle size of the component (E) is 0.5 to 10 μm.

6. A semiconductor device having a cured product of the epoxy resin composition for semiconductor encapsulation according to claim 1.

7. The semiconductor device according to claim 6, wherein at least part of the cured product is plated.

8. A method for producing the semiconductor device according to claim 7, wherein parts that have been irradiated with a laser are plated.

9. A method for encapsulating a semiconductor device, comprising the steps of:
   preparing the epoxy resin composition for semiconductor encapsulation according to claim 1;
   encapsulating the semiconductor device by molding and curing the epoxy resin composition to form a cured product of the epoxy resin composition;

irradiating a surface or inner region of the cured product with a laser; and plating the parts that have been irradiated with the laser.

10. The method according to claim 9, wherein the plating properties wherein the epoxy resin composition has plating properties that include that plated areas are formed in a continuous and uniform manner in a surface plating property evaluation or an inner plating property evaluation, wherein for the surface plating property evaluation, a YVO$_4$ laser marker at 1064 nm in a test mode is used to perform marking on the surface of a test specimen prepared under a condition of 175° C., 300 seconds, wherein the test specimen is then immersed in a Ni plating solution for 30 minutes with the temperature thereof being maintained at 80° C. so as to observe a plating property of the test specimen, wherein the Ni plating solution is prepared by mixing 75 ml of a makeup CNN-mod; 30 ml of an Aurotech CNN Part A; 395 ml of pure water; and 8 ml of an ammonia water, wherein for the inner plating property evaluation, a laser substrate cutting device is used to form 10 through holes of a size of 200 μmφ in a cured product having a thickness of 0.20 mm, wherein the cured product is then immersed in the Ni plating solution at 65° C. for 30 minutes so as to plate the through holes, wherein an inner plating property is confirmed by polishing the sections of these through holes, and then using a microscope to observe a plating property therein.

11. The method for according to claim 9, wherein the epoxy resin composition has plating properties include suppressing an impaired electric property in a high-temperature and high-humidity environment, which causes the metal parts of a semiconductor device to be corroded.

12. The method for according to claim 9, wherein the component (D) is such that after an aqueous dispersion of the component (D) is prepared by immersing 10 parts by mass of the component (D) in 50 parts by mass of pure water, and then left to stand at 125±3° C. for 20±1 hours, a sodium ion concentration in the aqueous dispersion of the component (D) is not higher than 16 ppm, and a chloride ion concentration in the aqueous dispersion of the component (D) is not higher than 14 ppm.

13. The method for according to claim 9, wherein the component (D) is added in the epoxy resin composition in an amount of 30 to 80 parts by mass per a total of 100 parts by mass of the components (A) and (B).

14. The method for according to claim 9, wherein the component (D) has an average particle size of 0.01 to 5 μm.

15. The method for according to claim 9, wherein a top cut particle size of the component (E) in a wet sieve method is 5 to 25 μm, and an average particle size of the component (E) is 0.5 to 10 μm.

* * * * *